United States Patent [19]
Wang

[11] Patent Number: 5,485,097
[45] Date of Patent: Jan. 16, 1996

[54] METHOD OF ELECTRICALLY MEASURING A THIN OXIDE THICKNESS BY TUNNEL VOLTAGE

[75] Inventor: Larry Y. Wang, San Jose, Calif.

[73] Assignee: Advanced Micro Devices, Inc., Sunnyvale, Calif.

[21] Appl. No.: 287,332

[22] Filed: Aug. 8, 1994

[51] Int. Cl.$^6$ .................................................. G01R 27/00
[52] U.S. Cl. ............................................ 324/765; 324/767
[58] Field of Search ...................... 324/765, 719, 324/767, 71.5, 768; 364/448

[56] References Cited

U.S. PATENT DOCUMENTS

| | | | |
|---|---|---|---|
| 4,323,842 | 4/1982 | McGarrity | 324/765 |
| 4,520,448 | 5/1985 | Tremintin | 364/448 |
| 5,023,561 | 6/1991 | Hillard | 324/719 |
| 5,032,786 | 7/1991 | Kimura | 324/765 |
| 5,285,151 | 2/1994 | Akama et al. | 324/765 |

*Primary Examiner*—Kenneth A. Wieder
*Assistant Examiner*—Kourosh Cyrus Khosravi
*Attorney, Agent, or Firm*—Davis Chin

[57] ABSTRACT

A method of electrically measuring thin oxide thickness by tunnel voltage in a device under test includes the steps of applying a predetermined value of current density through the device under test, measuring voltage developed across the device under test, and calculating the oxide electrical thickness through a predetermined calibration curve. This method is suitable for incorporation into an automatic tester for fast and high volume data collection. This technique also has higher resolution and accuracy than measurements obtained optically.

6 Claims, 3 Drawing Sheets

5,485,097

METHOD OF ELECTRICALLY MEASURING A THIN OXIDE THICKNESS BY TUNNEL VOLTAGE

BACKGROUND OF THE INVENTION

This invention relates generally to the field of manufacturing semiconductor integrated circuit devices and more particularly, it relate to a method of electrically measuring a thin oxide thickness by tunnel voltage in a semiconductor integrated circuit device on a more efficient and effective basis.

As is generally well-known to those skilled in the art of manufacturing wafer-scale semiconductor integrated circuit devices and in particular those related with flash EEPROM technologies, there is required in the fabrication process of the flash memory cell a critical thin dielectric in the form of a tunnel oxide for "F-N" (Fowler-Nordheim) tunneling. This tunnel oxide must be thin (i.e., approximately 100 Å) for F-N tunneling to provide erasing. Therefore, the precise control of the tunnel oxide thickness is essential during the fabrication of the flash memory cell. Further, as integration level increases, other technologies (such as general logic) also require thinner and thinner oxide (<100 Å) as gate oxide. Thus, the thickness control of the oxides in those applications has become equally important.

There is already known heretofore a technique for measuring optically the tunnel oxide thickness on test wafers after oxidation. However, as technology demands thinner and thinner oxides, the optical measurement of the oxide thickness on the test wafer becomes unreliable since this technique is generally accurate for measuring of thicknesses down to approximately 100 Å. Further, the thickness measurement performed on the test wafers may or may not be representative of the actual or true thickness on the individual product wafers due to a number of varying factors such as the furnace positions of the test wafers with respect to the individual product wafers, the conditions of the test wafers, the calibrations of the metrologies, the doping concentration of substrate of the product wafers, and the like. More importantly, it is the "electrical" oxide thickness that determines the performance of the devices and not necessarily the thickness measured optically. Therefore, there is a strong desire to know the oxide thickness electrically on the actual product wafers. In order to overcome these possible variations, a traditional method of measuring the oxide thickness is performed on the individual product wafers at the end of the wafer fabrication process which is achieved by a conventional capacitance measurement technique.

However, one major drawback of these capacitance measurement techniques is that they require relatively complex electronic circuits to perform the capacitance measurements, thereby resulting in increased manufacturing costs. In one such capacitance measurement technique, there is used a feedback charge method as disclosed in "Package 82 Simultaneous CV Instruction Manual," by Keithley Instruments, Inc., Cleveland, Ohio, 1987. This feedback charge method for making the capacitance measurements include a feedback charge amplifier functioning as an integrator and a feedback capacitor connected between the inverting input and the output of the amplifier. A switch is connected in parallel with the feedback capacitor. One terminal of the unknown capacitance is connected to a voltage source, and the other terminal end thereof is connected to the inverting input of the amplifier. In use, the voltage source applies a step voltage, and the charge on the feedback capacitor is determined by measuring the output of the integrator both before and after the step voltage. The unknown capacitance is then calculated through a known equation. As a result, it can be seen that such capacitance measurements cannot be easily incorporated into an automatic tester of the type similar to Model S900A Parametric Tester which is commercially available from Keithley Instruments, Inc. Therefore, such capacitance measurements must frequently be performed manually. Consequently, the tunnel oxide thickness on the individual product wafers are checked quite infrequently and then only on a few of the wafers.

It would therefore be desirable to provide an improved, convenient method of electrically measuring efficiently and effectively a thin oxide thickness by tunnel voltage on a product wafer on a lot-by-lot, wafer-by-wafer and site-by-site basis in a semiconductor manufacturing environment in order to monitor and detect both systematic and abnormal changes. Further, it would be expedient that the electrical measurement technique be easily incorporated into an automatic tester for fast and high volume data collection.

SUMMARY OF THE INVENTION

Accordingly, it is a general object of the present invention to provide an improved, convenient method of electrically measuring efficiently and effectively a thin oxide thickness by tunnel voltage, which has a higher resolution and accuracy than the prior art optical measurement techniques.

It is an object of the present invention to provide a method of electrically measuring a thin oxide thickness by tunnel voltage in a semiconductor integrated circuit device on a fast and reliable basis.

It is another object of the present invention to provide a method of electrically measuring a thin oxide thickness by tunnel voltage which is more convenient and easily incorporated into an automatic tester with virtually no measurement overhead.

It is still another object of the present invention to provide a method of electrically measuring a thin oxide thickness by tunnel voltage so as to enable monitoring of the same on a product wafer on a lot-by-lot, wafer-by-wafer, and site-by-site basis in order to detect systematic and abnormal changes.

In a preferred embodiment of the present invention, there is provided a method of electrically measuring a thin oxide thickness by tunnel voltage in a semiconductor integrated circuit device. A device under test whose thin oxide thickness is to be determined is provided with a first terminal and a second terminal. One of the first and second terminals is connected to a ground potential. A current density of a known value is forced through the other one of the first and second terminals by a forced measure unit. An initial tunnel voltage is measured across the first and second terminals. The oxide electrical thickness is then calculated through a predetermined calibration equation obtained between known initial tunnel voltage measurements and known oxide thickness measurements.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

As a background and in order to assist in the understanding of the present invention, it is important to realize that electron tunneling through a thin oxide can be characterized by the Fowler-Nordheim equation, which is stated as follows:

$$J = AE^2 \exp\left(-\frac{B}{E}\right) \quad (1)$$

where:

J=Tunneling current density

E=Electrical field across the tunnel oxide

A,B=Physical parameters determined by barrier height and effective mass

From equation (1), it can be seen that there is established a one-to-one relationship between the electrical field E and the tunneling current density J. Further, it is generally known that the relationship between the electrical field and the applied voltage can be expressed as:

$$E = V/T_{ox} \quad (2)$$

where:

V=applied voltage $T_{ox}$=thickness of oxide

Therefore, the changes in the oxide thickness is reflected in the changes of the applied voltage which is required to create a fixed electrical field and thus also a fixed tunnel current density. It is through the recognition of this principle by the inventor which has allowed him to discover a way of determining the oxide electrical thickness in a product wafer by employing the tunnel voltage at a fixed tunneling current density.

Figure 3:
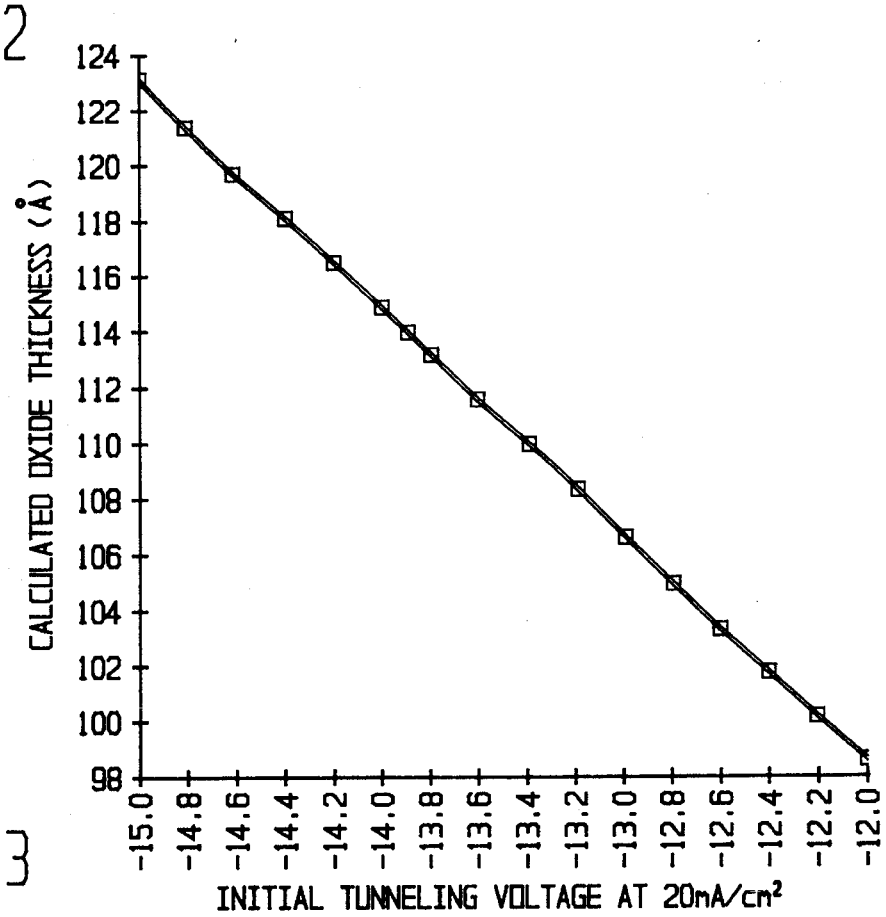
FIG. 3 is a plot of the calculated oxide thickness versus the initial tunneling voltage needed for 20 mA/cm$^2$ tunneling current, which is based upon the Fowler-Nordheim equation.

In FIG. 3, there is shown a graph of above equation (1) with equation (2) substituted therein, which illustrates the relationship between the calculated tunnel oxide thickness and the applied voltage required to establish the current density of 20 mA/cm$^2$ wherein the tunnel voltage is changed in the appropriate range. The values for the constants A and B were obtained with no correction factors from a textbook authored by Edward S. Yang which is entitled "Microelectronic Devices," McGraw-Hill Book Company, New York (1988). As can be seen from FIG. 3, it is demonstrated that a linear relationship exists between the applied voltage and the oxide thickness in this interested range. In other words, for every 0.1 volt change in the applied tunnel voltage there is found to be an approximate 1 Å change in the tunnel oxide thickness.

Given the linearity demonstrated by FIG. 3, above equations (1) and (2) can be simplified into a linear equation which can be expressed generally as follows:

$$T_{ox}(\text{Å}) = \alpha V_{init} + \beta \quad (3)$$

where:

$V_{init}$=initial tunnel voltage $\alpha$=slope of the line $\beta$=Y-intercept of the line The values for the constants $\alpha$ and $\beta$ can be determined experimentally through a calibration procedure as explained presently hereinbelow.

Figure 4:
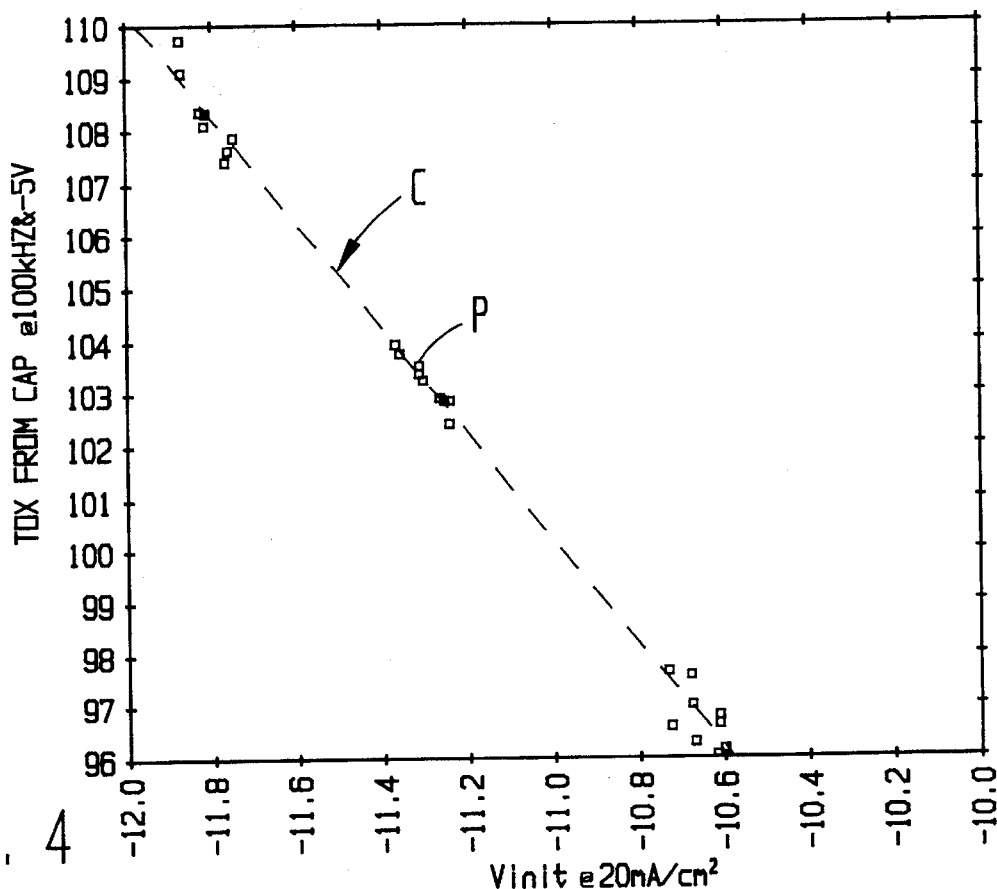
FIG. 4 is a plot of the tunnel oxide thickness as determined by capacitance measurement versus the initial tunneling voltage at 20 mA/cm$^2$.

In FIG. 4, there is illustrated a plot of the tunnel oxide thickness as determined by the capacitance measurement versus the tunnel voltage measurement at 20 mA/cm$^2$. The various plotted points P are obtained from different product wafers from different lots. Then, these various points are joined by a best fitting line C through a least square fitting technique. This curve or line C represents a predetermined calibration curve. Thus, it can be seen that after calibration against the oxide thickness obtained by the capacitance measurement technique, the above equation (1) can be simplified and expressed as follows:

$$T_{ox}(\text{Å}) = -10.096 * V_{init} - 10.804 \quad (4)$$

where:

$V_{init}$=initial tunnel voltage at 20 mA/cm$^2$

Figure 5:
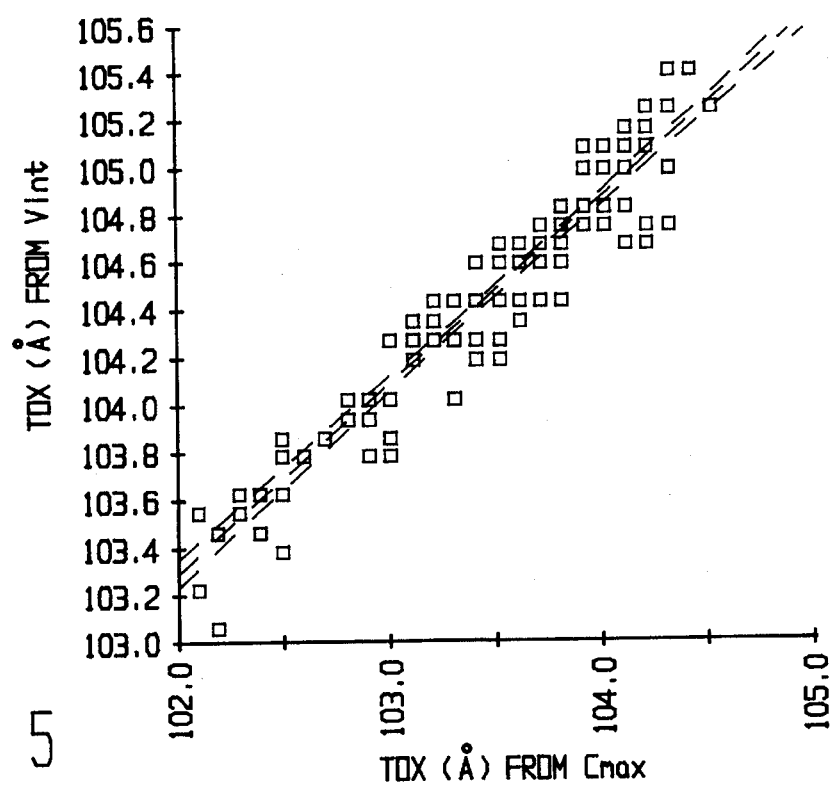
FIG. 5 is a plot of the oxide electrical thickness as determined by initial tunnel voltage measurement versus the tunnel oxide thickness as determined by capacitance measurements.

In FIG. 5, there is plotted a tunnel oxide thickness as measured on a particular product wafer utilizing both the prior art capacitance measurement technique and the initial tunneling voltage technique described above. In particular, the oxide thickness obtained by the capacitance measurement technique is shown along the X-axis, and the oxide thickness obtained by the initial tunneling voltage technique is shown along the Y-axis. The oxide thickness as measured by these two techniques is demonstrated to be in substantial agreement. The slight variation is due to measurement errors in both techniques.

In practice it should be understood that other factors will be frequently required to be taken into consideration in equation (1) and can cause measurement errors. For example, the polysilicon (poly) deposition and/or doping process can impact the texture of the interface between the poly layer and the oxide layer which causes changes in the barrier height and injection efficiency, thereby varying the values of the constants A and B. In addition, changes in the test structure may affect the effective tunneling areas, unwanted resistive loading and edge-related leakage. Further, electron and/or hole trapping will significantly cause changes in the tunneling voltage. It will be noted that a leaky oxide layer will never perform to the calculations from above equation (1) and should therefore be eliminated from the oxide thickness measurements. In order to minimize the aforementioned factors which create errors, there should be taken into consideration the following guidelines:

(A) There should be chosen a capacitor structure having a large enough area to avoid edge-related leakage;

(B) The tunnel current density should be set low (i.e., 20 mA/cm$^2$) so as to avoid resistive loading and possible rupture of the oxide;

(C) The tunnel current density should be set high enough so that the total current passing through the device under test is higher than the system noise level (i.e., typically in the $10^{-11}$ amp range);

(D) Only the initial tunnel voltage should be used so as to avoid errors introduced by charging; and (E) The calculations of equation (3) should be calibrated against a known thickness measurement (i.e., capacitance measurement). Since the linear region is valid within a range of oxide thickness, it may become necessary that a different set of constants $\alpha$, $\beta$ be calculated to different ranges of oxide thicknesses.

Figure 1:
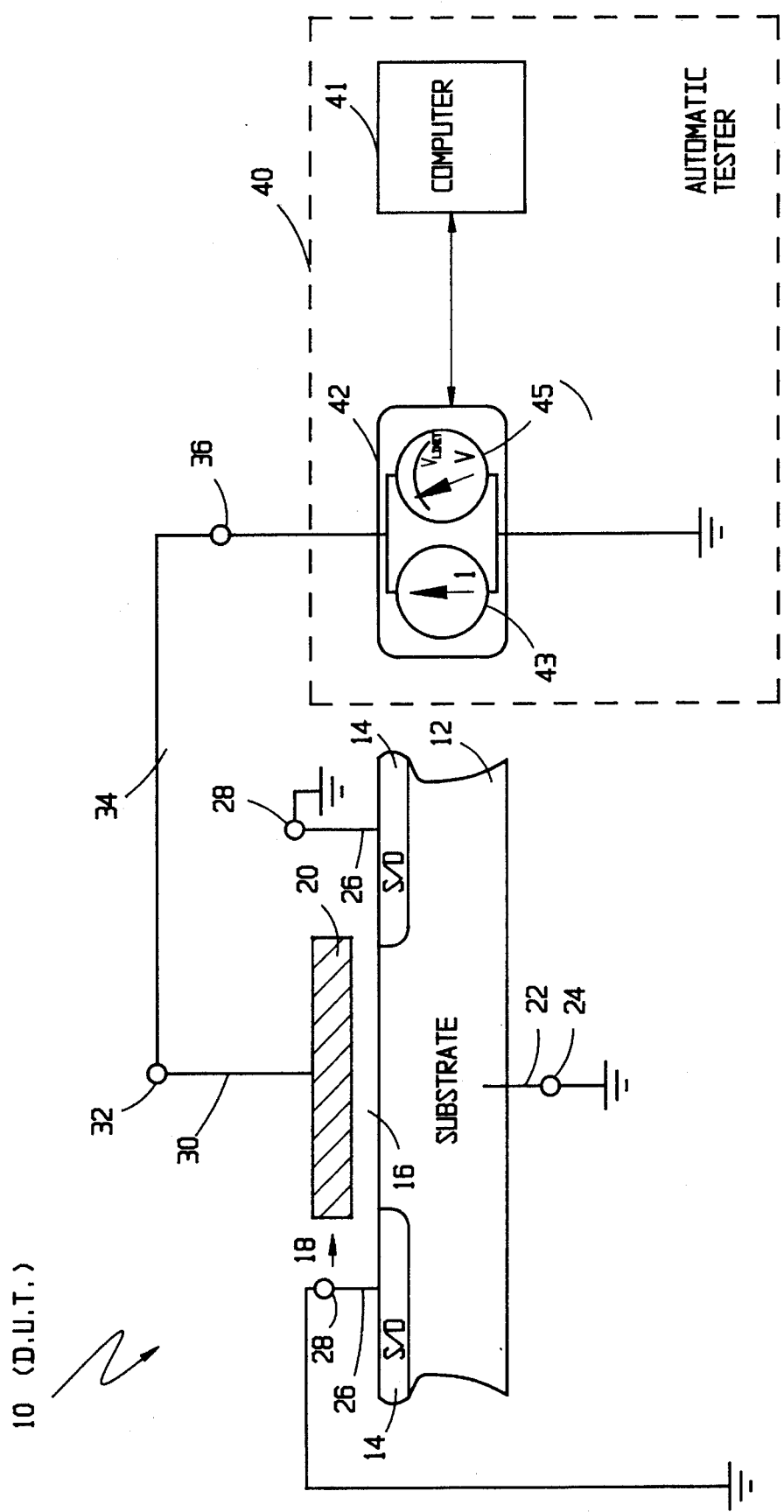
FIG. 1 is a side view of a measurement set-up for the method of electrically measuring the thin oxide thickness by tunnel voltage of a device under test, according to the present invention.
Figure 2:
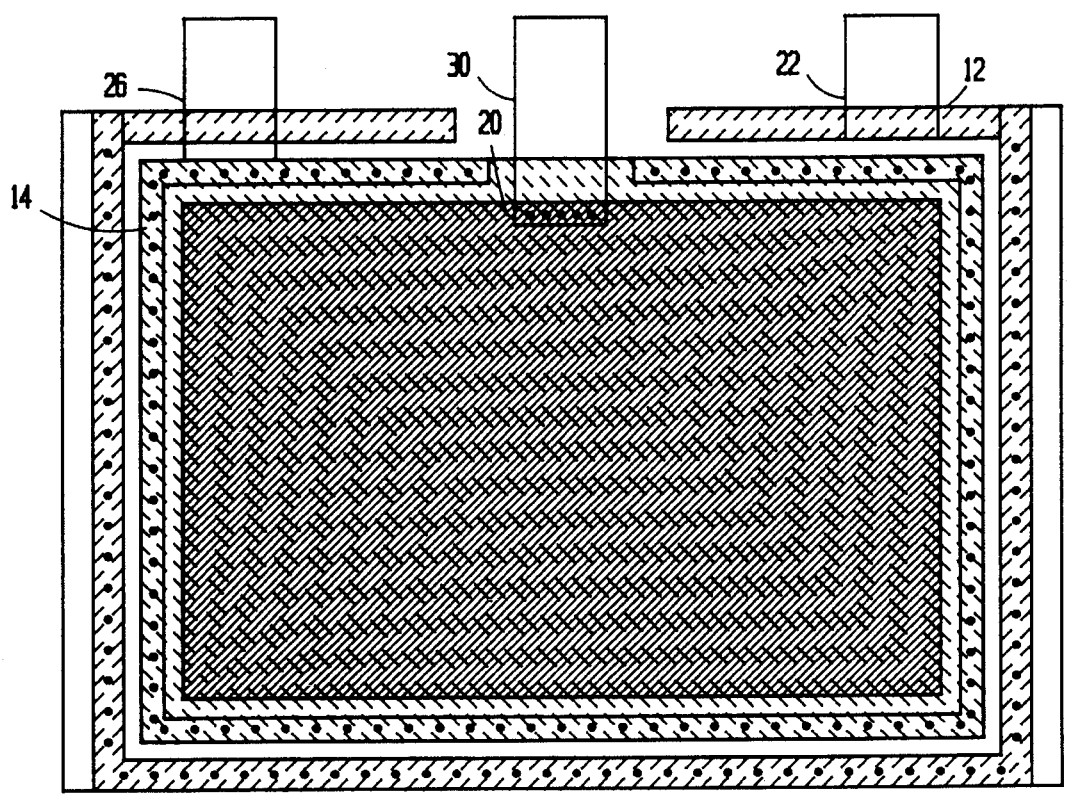
FIG. 2 is a top view of the lay-out of the device under test of FIG. 1.

In FIG. 1, there is illustrated a measurement setup for the method of electrically measuring the thin oxide thickness of a Device Under Test (DUT) 10 utilizing a tunneling voltage technique. The DUT 10 represents a product wafer at a particular site whose oxide thickness is desired to be measured. In FIG. 1, there is shown a sectional view of a portion of a MOS (metal-oxide semiconductor) integrated circuit device. It should be clearly understood by those skilled in the art that the present technique can be applied to determine thicknesses of any dielectrics (isolator) sandwiched between two electrodes.

The Device Under Test consists of a silicon substrate 12 of a semiconductor material. Source/drain regions 14 are formed on the substrate 12. The oxide thin film 16 is grown over the substrate 12. A gate structure 18 is formed on top of the oxide film 16. The gate structure 18 is comprised of a polysilicon layer 20 referred to as "poly" which is provided with a first metal contact area 30 connected to a terminal pin 32. Further, the source/drain regions 14 are provided with second metal contact areas 26 connected to terminal pins 28. The substrate 12 is also provided with a third metal contact area 22 connected to a terminal pin 24.

In order to use the tunneling voltage technique of the present invention, the terminal pins 28 and 24 of the DUT 10 are connected to a ground potential, and the terminal pin 32 thereof is connected via cable 34 to the output terminal 36 of an automatic tester 40, which is of the type similar to Model S900A Parametric Tester that is commercial available from Keithley Instruments, Inc. The automatic tester 40 includes a programmable, PC controlled DC tester having a controller which is a 486-based personal computer and an instrumentation sub-assembly package. The instrumentation package consists of voltage/current Force Measure Units (FMUs) which is operated by a computer 41 under a stored program and voltage and current meters (43, 45) operatively connectible to the DUT 10. Further, the instrumentation package includes pin matrix probes, probe cables, probe card, and other related hardware, which have been purposely omitted for the sake of clarity.

In the present case, the FMU 42 in the automatic tester 40 has been configured so as to force a current I through the DUT 10 and a voltage V is measured across the terminal pins 28 and 32. This measured voltage V corresponds to the initial tunneling voltage in above equation (4). This equation (4) defining a predetermined calibration equation is also stored in the computer 41 and the computer calculates the oxide electrical thickness based upon the measured tunneling voltage. The oxide electrical thickness is in the approximate range of 50 Å to 100 Å. Thinner oxides (<50 Å) could also be measured in a similar fashion.

In this manner, it can be seen that there has been provided a simple technique for measuring the tunnel oxide electrical thickness on a product wafer which is more convenient and can be easily implemented without any increase in costs. This technique provides the capability of monitoring of the oxide thickness on a product wafer on an efficient and effective basis and permits analysis of the oxide thickness variations thereof. Further, the tunnel oxide thickness on every individual product wafer can be analyzed based upon a lot-by-lot variation, wafer-by-wafer variation within a particular lot, and site-by-site variation within individual product wafer.

From the foregoing detailed description, it can thus be seen that the present invention provides an improved, convenient method of electrically measuring a thin oxide thickness by tunnel voltage in a device under tests. This method includes the steps of applying a predetermined value of current to the device under test, measuring a voltage developed across the device under test, and calculating then the oxide electrical thickness through a predetermined calibration curve.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of electrically measuring a thin oxide thickness by tunnel voltage in a semiconductor integrated circuit device, said method comprising the steps of:

providing a device under test whose thin oxide thickness in the range of 50 Å to 100 Å is to be determined in which said device under test has a first terminal and a second terminal;

connecting one of said first and second terminals to a ground potential;

forcing a fixed current density of 20 mA/cm$^2$ so as to avoid resistive loading and to prevent rupture of the oxide through the other one of the first and second terminals by a forced measure unit;

measuring an initial tunneling voltage developed across the first and second terminals; and calculating the oxide electrical thickness through a predetermined calibration equation obtained between known initial tunneling voltage measurements and known oxide thickness measurements.

2. A method as claimed in claim 1, wherein said device under test comprises a product wafer taken from different lots so as to determine lot-to-lot variations.

3. A method as claimed in claim 1, wherein said device under test comprises a product wafer taken from a particular lot so as to determine wafer-to-wafer variations.

4. A method as claimed in claim 3, wherein said device under test comprises different sites within a product wafer so as to determine site-to-site variations.

5. A method as claimed in claim 1, wherein said force measure unit is formed as a part of an automatic tester which is capable of being operatively connectible to the device under test.

6. A method as claimed in claim 1, further comprising the steps of plotting a plurality of points representing oxide thickness obtained by a capacitance measurement against corresponding measured tunneling voltages at a selected current density, deriving a line through said plurality of points by a fitting equation, and calculating the slope and Y-intercept of the line so as to determine said predetermined calibration equation.

* * * * *